(12) United States Patent
Männer

(10) Patent No.: US 6,198,612 B1
(45) Date of Patent: Mar. 6, 2001

(54) METHOD AND APPARATUS FOR THE MONITORING OF ELECTRIC LINES

(75) Inventor: Bernd Männer, Bahlingen (DE)

(73) Assignee: Sick AG, Waldkirch/Breisgau (DE)

( * ) Notice: Subject to any disclaimer, the term of this patent is extended or adjusted under 35 U.S.C. 154(b) by 0 days.

(21) Appl. No.: 09/246,470

(22) Filed: Feb. 9, 1999

(30) Foreign Application Priority Data

Feb. 12, 1998 (DE) .............................. 198 05 722

(51) Int. Cl.$^7$ ..................................... H02H 3/28
(52) U.S. Cl. ..................... 361/86; 361/170; 324/527
(58) Field of Search ........................ 361/78, 23, 86, 361/170, 179, 187, 180; 324/50, 522, 511, 527

(56) References Cited

U.S. PATENT DOCUMENTS

| | | | |
|---|---|---|---|
| 3,857,069 | * 12/1974 | Howell | 361/45 |
| 3,935,510 | * 1/1976 | Clarke | 361/45 |
| 4,179,651 | * 12/1979 | Vitins | 324/51 |
| 5,329,415 | * 7/1994 | Oyamada | 361/86 |
| 5,488,308 | * 1/1996 | Kirka et al. | 324/555 |
| 5,559,664 | * 9/1996 | Gogul et al. | 361/191 |
| 5,576,632 | * 11/1996 | Petsche et al. | 324/772 |
| 5,600,523 | * 2/1997 | Park | 361/42 |

* cited by examiner

Primary Examiner—Michael J. Sherry
Assistant Examiner—Kim Huynh
(74) Attorney, Agent, or Firm—Townsend and Townsend and Crew LLP

(57) ABSTRACT

Two or more electric lines which transmit switching signals are monitored for short circuits. A difference voltage other than zero is at least intermittently applied to the lines which carry switching signals. The actual difference voltage between two lines is essentially continuously determined and a fault recognition signal representative of a short circuit between the two lines is produced when the measured difference voltage plot or the measured difference voltage differs from a predetermined reference voltage plot or from a predetermined reference voltage. An apparatus including a signal generator and an evaluation circuit determines when the measured voltage plot or voltage differs from the reference voltage or reference voltage plot and generates a signal with which the electric lines can be interrupted.

32 Claims, 3 Drawing Sheets

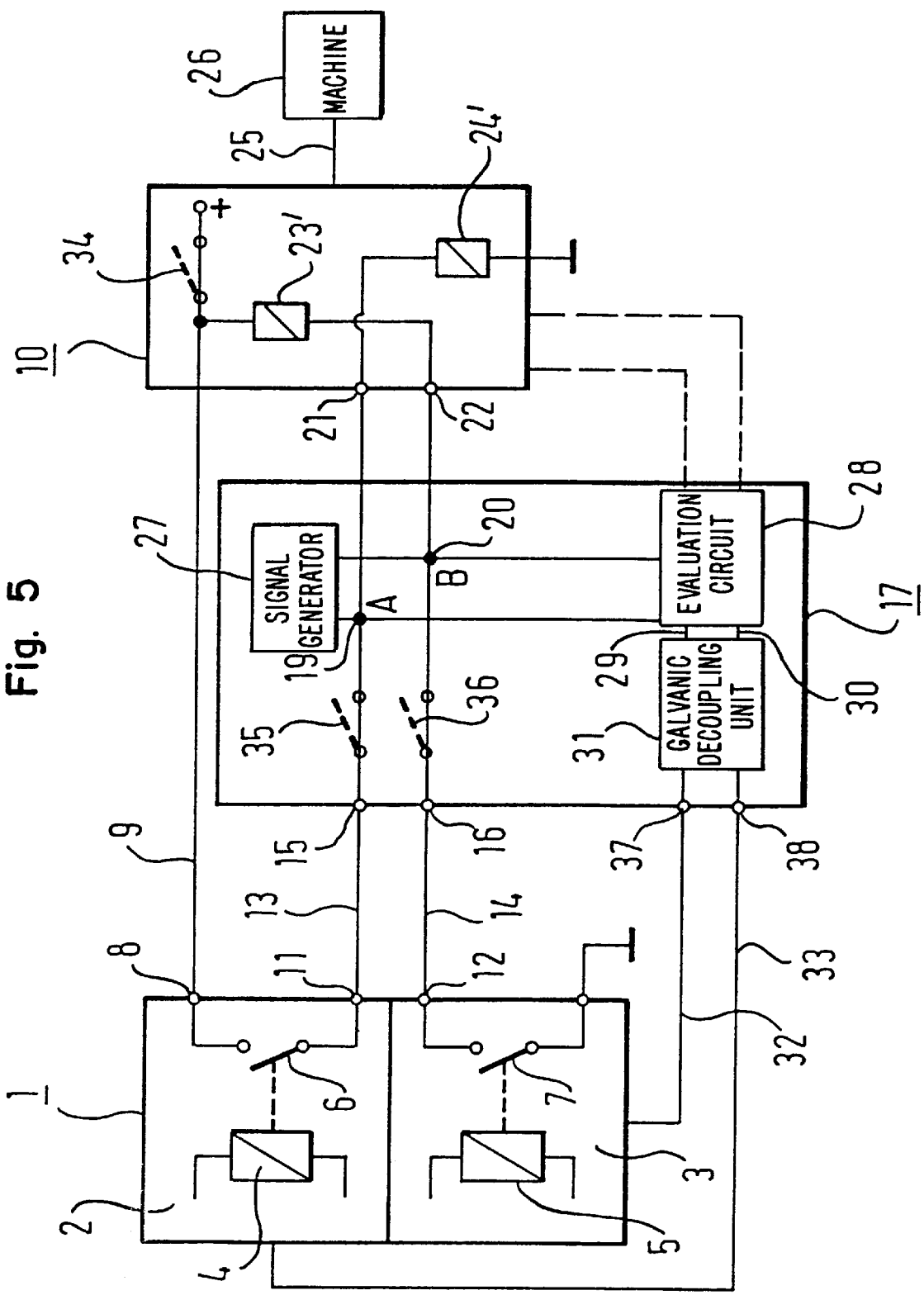

METHOD AND APPARATUS FOR THE MONITORING OF ELECTRIC LINES

BACKGROUND OF THE INVENTION

The present invention relates to a method and to an apparatus for the monitoring of electric lines for short circuits. In particular the invention relates to a method and an apparatus of this kind such as are used in the monitoring of so-called OSSD lines (output-safety-switching device lines) of protective devices for the monitoring of protected regions.

In order to secure dangerous locations, such as are, for example, formed by fully automatic machines, presses and the like, use is made of preferably protective devices having object detection units, in particular object detection units which are operating in contact-free manner, for example in the form of light grids.

In this respect it must be ensured that, in the event of an object entering into the protected region, a corresponding switching signal is sent to the machine control so that the machine operating in the protected region is automatically switched off.

Depending on the danger potential of the machine, the entire system, i.e. the protective device with the object detection unit, machine control and also the connection between these two units, must meet a specific safety classification in order to still be able to switch off reliably when possible faults occur in part of this system. In this respect, for systems of the safety class 4, the requirement exists, amongst other things, that the electric lines, via which the switching signal is transmitted from the protective device to the machine control, must be present in duplicate in redundant manner, so that a fault on one of these lines is reliably recognized by a comparison with the fault free line.

In this respect it is problematic that cross connections, i.e. short circuits between the two lines, cannot be recognized by a comparison of the switching signals applied to the lines, because these are in all cases identical in the event of a cross-connection. In order to be able to ensure also the required safety for this part of the monitoring device, previously complicated measures, such as, for example, a dual laying of the lines, the use of screened lines or a laying of lines in a conduit, were necessary.

BRIEF SUMMARY OF THE INVENTION

The present invention is based on the object of so developing a method and also an apparatus for the monitoring of electrical lines for short circuits that it is possible to dispense with complicated design measures but to simultaneously ensure that cross connections between the lines are reliably recognized.

The part of the object relating to the method is satisfied by a method in which the actual difference voltage between two lines is substantially continuously determined and a fault recognition signal representative of a short circuit between these two lines is produced when the measured course of the difference voltage, or the measured difference voltage, differs from a predetermined reference voltage course, or from a predetermined reference voltage.

An apparatus in accordance with the invention comprises at least two monitoring inputs, to which the lines to be monitored, in particular lines conducting switching signals, are connectable, a signal generator for generating a difference voltage which is different from zero, at least at times, between two signal outputs of the signal generator, wherein each of the signal outputs is respectively connected with one of the monitoring inputs and comprising an evaluation circuit, with which the actual difference voltage between two respective monitoring inputs can be found and can be checked for the maintenance of a preset reference voltage.

Thus, in accordance with the invention, for the recognition of such a cross connection, the fact is exploited that with a cross connection the voltage signals present at the two lines to be monitored are essentially the same. In the event of a fault, the difference voltage measured as a result of the cross connection between the two lines is essentially zero, or only a relatively small residual voltage is present as a result of residual resistances between the lines. When the two lines are fault free an at least significantly higher voltage corresponding to the applied difference voltage is present. Thus one can assume the Fault Free case as long as the course or shape of the difference voltage measured by the evaluation circuit corresponds to a reference voltage course or shape representative for the fault free case.

If, in contrast, the measured difference voltage course differs from the preset reference voltage course, then a fault is present. This can consist of a short between the monitored lines, which is reliably detected by the method of the invention.

In accordance with a preferred embodiment of the invention, DC voltage switching signals are essentially used as the switching signals. However, the use of alternating voltage switching signals is also basically possible, as long as the machine control can evaluate these signals for the control of the machines to be monitored.

The lines are advantageously energized with mutually phase-shifted AC voltage signals, in particular with opposite phase AC voltage signals for the generation of the difference voltage. In this respect the amplitudes of the alternating voltage signals can be different and also of the same size, since the phase-shift ensures that the difference signal has a value different from zero, at least at times.

In particular when the AC voltage signals are formed as periodic signals with the same period and the same amplitude and, for example, sinusoidal or rectangular signals are used, the difference voltage has, in the Fault Free case, a course or shape which is particularly simple to evaluate. The AC voltage signals preferably have a frequency between 5 and 20 kHz, in particular of about 10 kHz, and an amplitude between 0.5 and 5 V, in particular between about 1 to 1.5 V. It is, however, basically also possible to use other signal shapes for the alternating voltage signal to be superimposed on the lines, as long as the alternating voltage signals that are used have a phase difference relative to one another which is different from zero, or have different amplitudes.

It is, however, also basically possible to energize the lines with DC voltage signals to produce the difference voltage. In this case the DC voltage signals must, however, have different levels, in particular two levels, of which one preferably lies between about 0 V and 1 V, in particular is smaller than 0.5 V, and the other preferably lies between 7 and 30 V, and in particular amounts to about 24 V. When using DC voltage signals, the required difference voltage is defined by the different levels of the individual voltages.

In accordance with a further advantageous embodiment of the invention, the fault recognition signal is produced when the measured difference voltage falls short of a preset threshold value for a specific time duration, in particular when the measured difference voltage is substantially the same as zero, at least for a specific time duration. By presetting a specific minimum voltage a minimum time measurement fluctuation can be compensated so that short term faults do not lead to a faulty evaluation of the difference voltage. It is, however, also possible for the measured difference voltage to be compared with a reference voltage and for the fault recognition signal to be produced when the difference voltage differs from the reference voltage by a predetermined value or when the difference voltage course differs from the reference voltage course in a predetermined manner.

Through the apparatus of the invention it is possible in simple manner both to retrofit an already present protective device in which no monitoring of the OSSD lines takes place, by supplementing the device with a separate line monitoring unit, and also to provide a corresponding line monitoring unit, when building up the entire monitoring system. In this respect the line monitoring unit of the invention can be provided both in the protective device, or directly at the protective device which carries out the protected field monitoring, within or at the machine control or also at any other desired point between these two positions, where a switching of the monitoring inputs onto the OSSD lines is possible.

The invention can be used in a very cost favorable manner, particularly through the simple retrofitting capability, because already existing plants can be classified in a better safety class simply by installing an apparatus in accordance with the invention.

BRIEF DESCRIPTION OF THE DRAWINGS

In the following the invention will be described in more detail with respect to embodiments and the following drawings, in which are shown.

DESCRIPTION OF THE PREFERRED EMBODIMENTS

Figure 1:
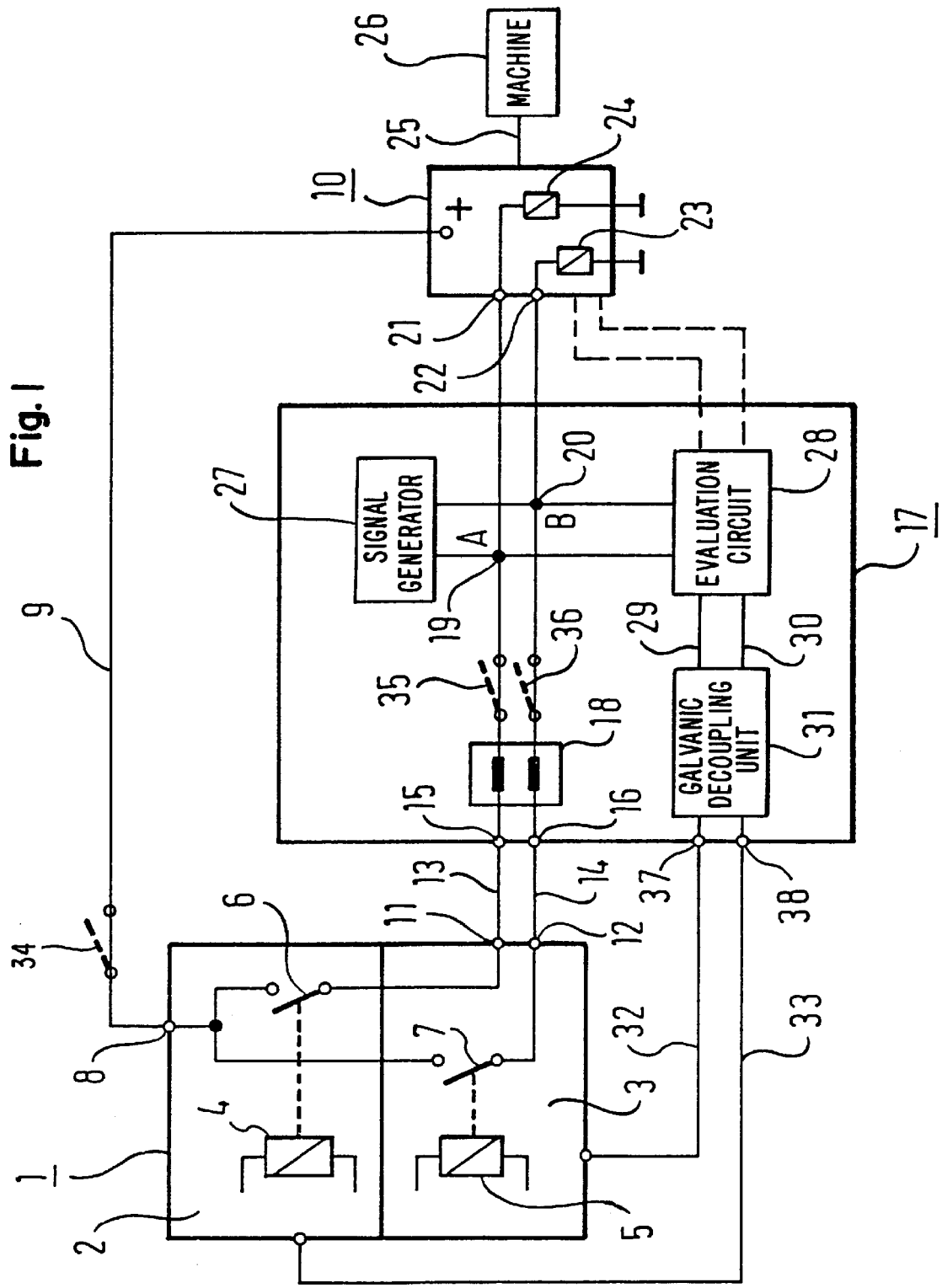
FIG. 1 is a block circuit diagram of an apparatus formed in accordance with the invention.

FIG. 1 shows, greatly simplified, a protective device 1 including an object detection unit and two symbolically illustrated channel evaluation blocks 2, 3.

Each of the channel evaluation blocks 2, 3 contains a relay 4, 5, by which in each case a switch 6, 7 can be controlled, i.e. can be switched on and off. It is basically also possible for the switching process to be carried out by semiconductor switches.

The switches 6, 7 are connected to one another at their input side, to a supply voltage input 8, at which a switching potential of, for example, 24 V which is delivered via a line 9 from a machine control 10 arranged in a switching cabinet. The supply of the switching potential can, in this arrangement, be interrupted via a switch 34 illustrated in broken lines. The switches 6, 7 can basically also be supplied with the required switching potential via mutually separated lines, in particular via galvanically decoupled lines. In this case each of the supply lines can advantageously be interrupted by a switch.

The output sides of the switches 6, 7 are respectively connected to a safety output 11, 12 of the protective device 1, to which an OSSD line 13, 14 is in each case connected. The two OSSD lines 13, 14 are each connected to monitoring inputs 15, 16 of a schematically illustrated line monitoring unit 17. In this respect the OSSD lines 13, 14 are led from the monitoring inputs 15, 16 via a signal decoupling device 18 and two switches 35, 36 shown in broken lines to two connection points 19, 20 designated by A and B, from where they extend up to the inputs 21, 22 of the machine control 10.

The OSSD lines 13, 14 are connected within the machine control 10 to earth with two inductive loads 23, 24 formed as relays, with which a machine 26 connected via a line 25 to the machine control 10 can be controlled and can in particular be switched on and off. Instead of inductive loads, any other desired loads, for example capacitive or ohmic loads can also be used.

The machine 26 is a machine having a working zone which lies within a protected region monitored by the protective device 1. On the detection of an object within the protected region by the protective device 1, the switches 6, 7 are opened in the fault free case via the relays 4, 5 so that the machine 26 is switched off via the motor relays 23, 24 of the machine control 10. In this manner an injury caused by the machine 26 to a person entering into the protected region is prevented.

A signal generator 27 is connected to the connection points 19, 20 designated by A and B and superimposes mutually phase-displaced alternating voltage signals onto the OSSD lines 13, 14. The difference signal A-B between the OSSD lines 13, 14 is likewise tapped off by an evaluation circuit at the connection points 19, 20. The evaluation circuit 28 can basically also tap off the difference voltage at other points of the OSSD lines 13, 14.

Figure 2:
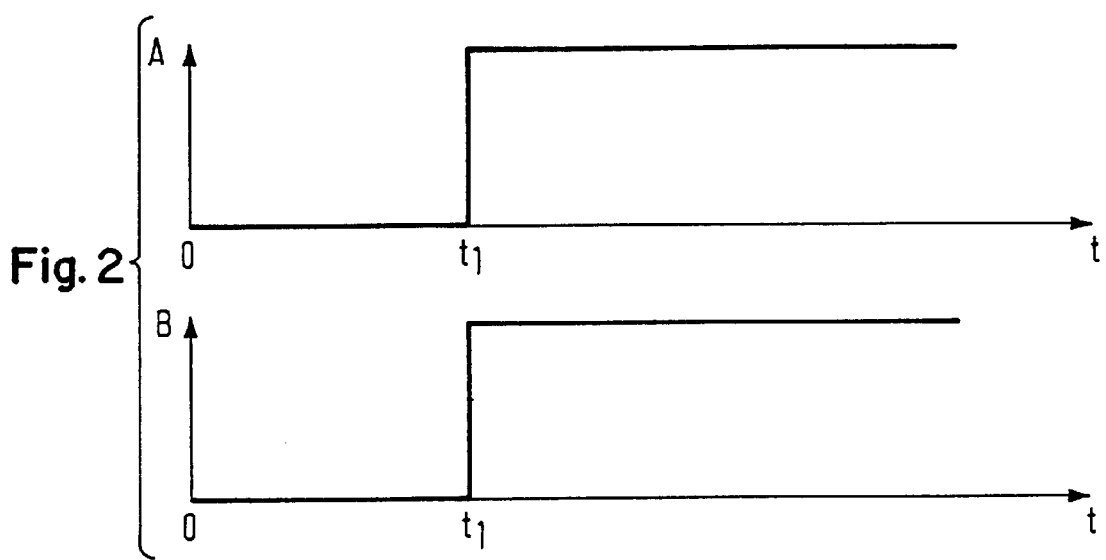
FIG. 2 illustrates the course of the DC voltage switching signals at the OSSD lines without a superimposed alternating voltage signal in accordance with the invention.

The evaluation circuit 28 is connected via lines 29, 30 to a galvanic decoupling unit 31, which is in turn connected via lines 32, 33 to the channel evaluation blocks 2, 3 of the protective device 1. Furthermore, the evaluation circuit 28 can be additionally or alternatively connected to the switches 34, 35, 36 of the machine control 10, as is shown in broken lines. Basically it has to be possible for the evaluation circuit 28 to so influence the total system that the machine can be switched off as a result of a fault recognition signal produced by the evaluation circuit. The manner of operation of the apparatus of the invention in accordance with FIG. 1 will be described in more detail in the following with reference to FIGS. 2, 3 and 4, with FIGS. 2 and 3 respectively showing the voltage signals at the points A and B of the OSSD lines 13, 14, and with the difference signal A-B between these two points being schematically illustrated in FIG. 4.

In FIGS. 2a) and b) there is in each case shown the course of the DC voltage switching signal at the OSSD lines 13, 14 without the superimposing of an alternating voltage in accordance with the invention. In this respect the range from $0 < t < t_1$ represents a time interval in which the switches 6, 7 are open so that a voltage of 0 V is present at the points A and B. This is, on the one hand, the case when the apparatus is in the switched off state and, on the other hand, the case when the entry of an object into the protective region has been recognized by the protective device 1, and the switches 6, 7 were then opened via the relays 4, 5.

If the apparatus is switched on, or if no object is recognized in the protected region by the protective device 1, then the switches 6, 7 are closed, so that the switching potential present via the supply voltage input 8 at the switches 6, 7 is applied to the connection points 19, 20, as is shown in FIGS. 2a) and b) from the time t>$t_1$ onwards.

Through the switching voltage the relays 23, 24 are closed, so that the machine 26 is switched on or remains switched on by the machine control 10 as a result of the simultaneously closed relays 23, 24.

In the event of a short circuit between the OSSD lines 13, 14, the same potential is present at these lines, so that the machine control 10 in all cases detects the same switching behavior for the relays 23, 24. If a further fault comes in addition to the cross connection, for example in the form of a switch 6 or 7 which sticks in its closed position, then despite the opening of the other operative switch 7, 6, the unitary switching state "ON" of the relays 23, 24 is detected by the machine control 10, and the machine 26 is not switched off, which is incorrect.

In order to prevent this situation, two mutually phase-shifted AC voltage signals are coupled in accordance with the invention by the signal generator 27 onto the OSSD lines 13, 14 and lead, for example, to the plots of the voltages at the OSSD lines 13, 14 shown in FIGS. 3a and 3b. In this connection it can be seen that the signals present at the OSSD lines 13, 14 run with opposite phase, so that in the Fault Free case the difference signal results in the form shown in FIG. 4.

Figure 3:
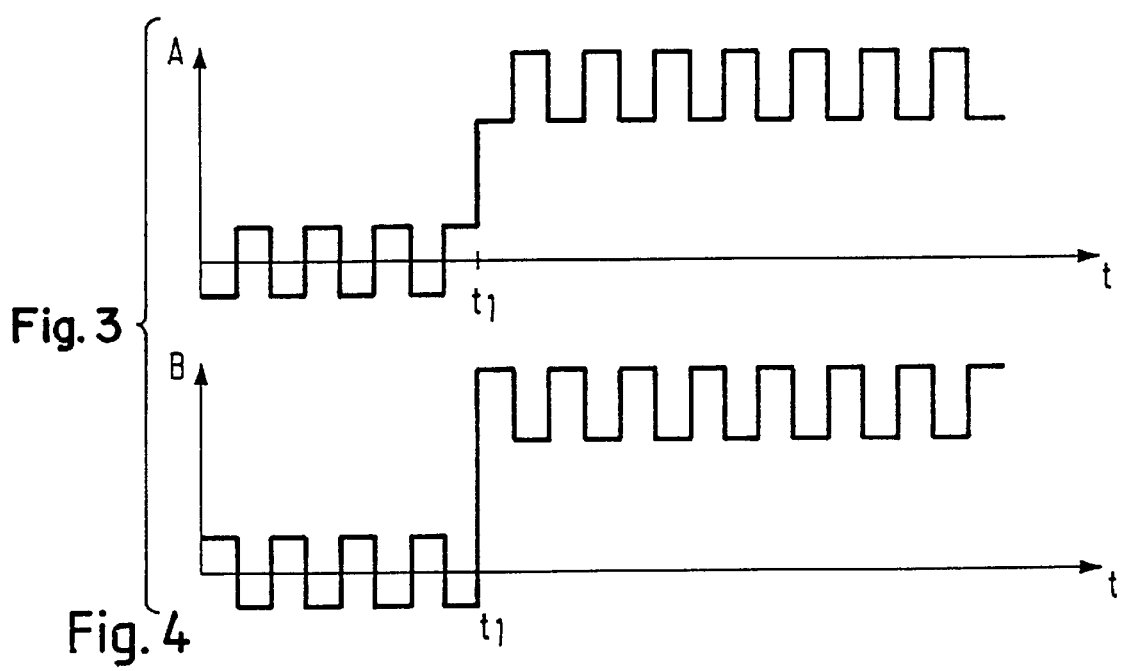
FIG. 3 illustrates the course of the switching signal on the OSSD lines, with a superimposed alternating voltage signal in accordance with the invention.
Figure 4:
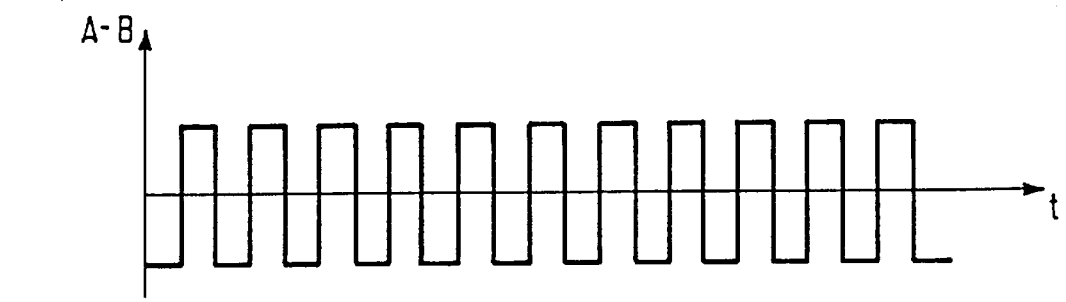
FIG. 4 illustrates the difference signal between the OSSD lines evaluated in accordance with the invention, and FIG. 5 showing a further embodiment of the invention.

The amplitude relationships shown in FIGS. 3 and 4 have been shown exaggerated for the purpose of illustration. In practice, the amplitude of the looped in AC voltage signal will be substantially lower, for example ca. 10% of the maximum value of the DC voltage switching signal.

The difference signal A-B is tapped off by the evaluation circuit 28 and then checked to see whether it corresponds to the reference signal shown in FIG. 4 within certain boundary values. If this is the case, then it can be assumed that no short circuit is present between the OSSD lines 13, 14 and the safety of the apparatus is ensured.

In the event of a short circuit between the OSSD lines 13, 14, the same voltage is present at the OSSD lines 13, 14, so that the difference signal A-B is equal to zero within the entire range 0<t<$t_1$ and t>$t_1$. The evaluation circuit 28 thus recognizes that no difference signal is present and transmits corresponding switching off signals via the outputs 29, 30, the galvanic decoupling unit 31 and lines 32, 33 to the channel evaluation circuits 2, 3 of the protective device 1. As a result of the switching off signal, the switches 6, 7 are opened, so that the machine 26 is switched off via the relays 23, 24 of the machine control 10.

If the switching signals delivered by the evaluation circuit 28 are also evaluated by the machine control 10, then, in the event that one of the switches 6, 7 remains stuck in its closed position, in addition to the cross connection between the OSSD lines 13, 14, the cross connection can also be recognized and the machine 26 can be switched off despite the simultaneously closed relays 23, 24 by the machine control 10 as a result of the switching off signals delivered by the evaluation circuit 28.

Even if one of the lines 13, 14 has a short circuit to the supply voltage, in addition to the short circuit between the OSSD lines 13, 14, then this is recognized by the apparatus in accordance with the invention, since in this case the difference voltage A-B is also equal to zero. Thus, this fault can also be reliably recognized by the method of the invention and by the apparatus of the invention and a corresponding reaction takes place, so that the danger to a person or objects entering into the protected region is prevented.

The apparatus of the invention and also the method of the invention can be used for any desired loads 23, 24 which are connected together. This is shown by way of example with reference to FIG. 5, in which, in contrast to FIG. 1, only the connection of the loads 23', 24' differs relative to the apparatus shown in FIG. 1.

In the embodiment shown in FIG. 5, the supply voltage is present, on the one hand, at the switch 6, and, on the other hand, directly at the load 23'. Whereas, as in FIG. 1, the supply voltage is led via the switch 6 to the second load 24', the supply voltage of the second channel is directly connected to the load 23', so that the switch 7 is provided between the load 23' and the ground.

This circuit leads to a situation in which a cross connection between the OSSD lines 13, 14 can be recognized, when the switches 6, 7 are closed, in that the supply voltage is drawn to earth.

If, in contrast, the switches 6, 7 are open, then the loads 23', 24' act as a voltage divider with a cross connection between the OSSD lines 13, 14, so that, depending on the dimensioning of the loads 23' and 24' and of the supply voltage, the machine 26 would not be erroneously switched off without the monitoring unit 17 of the invention.

This faulty function is reliably prevented by the apparatus of the invention, as was already explained in detail with reference to FIGS. 1 to 4.

The apparatus designed in accordance with the invention can thus be used flexibly and can in particular also be integrated into existing systems, so that these can be retrofitted in order to satisfy the requirements of the desired safety class.

What is claimed is:

1. A method for the monitoring of first and second electric lines for faults caused by a short circuit between them comprising applying substantially identical useful signals to the electric lines;

additionally applying continuously differing voltage signals to the electric lines, the voltage signals being selected so that in the absence of a short circuit between the electric lines a voltage difference other than zero is at least at times present between the electric lines;

substantially continuously determining an actual voltage difference between the first and second electric lines;

and generating a fault recognition signal representative of a short circuit between the first and second electric lines when a course of the voltage difference is detected during the step of determining which differs from a predetermined reference voltage course, or when a voltage difference is detected during the step of determining which differs from a predetermined reference voltage.

2. A method according to claim 1 wherein the step of applying useful signals comprises applying switching signals to the electrical lines.

3. A method in accordance with claim 2 including applying substantially the same switching signal to the electrical lines.

4. A method in accordance with claim 2 wherein the switching signals comprise DC voltage switching signals.

5. A method in accordance with claim 2 wherein one of the switching signals has between 0 and 1 V and the other switching signal has between 7 and 30 V.

6. A method according to claim 5 wherein the one switching signal has less than about 0.5 V and the other switching signal has about 24 V.

7. A method in accordance with claim 1 wherein the step of additionally applying voltage signals comprises additionally applying mutually-phase shifted AC voltage signals.

8. A method in accordance with claim 7 wherein the step of additionally applying comprises applying counter-phase AC voltage signals.

9. A method in accordance with claim 7 wherein the step of additionally applying comprises applying AC voltage signals having substantially the same amplitude.

10. A method in accordance with claim 7 wherein the step of additionally applying comprises applying periodic AC voltage signals having the same period.

11. A method in accordance with claim 7 wherein the step of additionally applying comprises applying one of sinusoidal and rectangular pulse signals as the AC voltage signals.

12. A method in accordance with claim 7 wherein the AC voltage signals have a frequency between 5 and 20 kHz.

13. A method according to claim 12 wherein the AC voltage signals have a frequency of about 10 kHz.

14. A method in accordance with claim 7 wherein the AC voltage signals have an amplitude between 0.5 and 5 V.

15. A method according to claim 14 wherein the AC voltage signals have an amplitude between about 1 to 1.5 V.

16. A method in accordance with claim 1 wherein the step of additionally applying comprises additionally applying AC voltage signals having different amplitudes.

17. A method in accordance with claim 1 wherein the step of additionally applying comprises additionally applying DC voltage signals having different voltage levels to produce the difference voltage.

18. A method in accordance with claim 1 wherein the step of generating the fault recognition signal is executed when the actual difference voltage falls short of a predetermined threshold value over a predetermined time duration.

19. A method according to claim 18 wherein the fault recognition signal is produced when the actual difference voltage is about zero for at least a predetermined time duration.

20. A method in accordance with claim 1 wherein the step of generating the fault recognition signal is executed when the actual difference voltage differs from the reference voltage by a predetermined value.

21. An apparatus for monitoring first and second electric lines for faults caused by a short circuit between them comprising first and second monitoring inputs respectively connected to the electric lines; means applying substantially identical useful signals to the electric lines; a signal generator substantially continuously applying differing voltage signals to the electric lines, the voltage signals being selected so that in the absence of a short circuit between the electric lines a voltage difference other than zero is at least at times present between the electric lines; and an evaluation circuit substantially continuously monitoring an actual voltage difference between the electric lines and comparing the monitored actual voltage difference with a predetermined reference voltage, so that a fault recognition signal can be generated when the actual voltage difference between the electric lines differs from a predetermined reference voltage.

22. Apparatus in accordance with claim 21 including first and second control devices for coupling to the first and second monitoring inputs, and wherein the evaluation circuit includes control outputs for connection to the control devices and which receive the fault recognition signal.

23. Apparatus according to claim 21 including a machine operatively coupled to and controlled by the evaluation circuit.

24. Apparatus according to claim 23 wherein the evaluation circuit causes the machine to be switched off when a difference between the actual difference voltage and the reference voltage indicates a short circuit between the lines.

25. Apparatus according to claim 21 wherein the first and second electric lines carry switching signals.

26. Apparatus for the monitoring of a protected region comprising: a protection device with an object detection unit for detecting objects entering into the protected region; a machine control for controlling machines operating in the protected region; first and second redundant electrical lines carrying the same signals from the protection device; first and second monitoring inputs respectively connected with the lines; means applying substantially identical useful signals to the electric lines; a signal generator substantially continuously applying differing voltage signals to the electric lines, the voltage signals being selected so that in the absence of a short circuit between the electric lines a voltage difference other than zero is at least at times present between the electric lines; and an evaluation circuit substantially continuously monitoring an actual voltage difference between the electric lines and comparing the monitored actual voltage difference with a predetermined reference voltage, so that a fault recognition signal can be generated when the actual voltage difference between the electric lines differs from a predetermined reference voltage.

27. Apparatus in accordance with claim 26 wherein the lines are connected to a predetermined switching potential; and including switches in the lines and controlled by the protection device for connection and separation of the switching potential to or from the machine control.

28. Apparatus in accordance with claim 27 including relays for controlling the switches.

29. Apparatus according to claim 26 wherein the machine control causes a switching on or off of the machines in the protected region.

30. Apparatus according to claim 26 including semiconductor devices for controlling the switches.

31. A method of monitoring a protected region with a protection device in which the entering of an object into the protected region produces an object detection signal and in which a control signal is sent as a result of the object detection signal over first and second independent electric lines to a machine control for switching on and off machines operating within the protected region, the method comprising the steps of applying substantially identical useful signals to the electric lines; additionally applying continuously differing voltage signals to the electric lines, the voltage signals being selected so that in the absence of a short circuit between the electric lines a voltage difference other than zero is at least at times present between the electric lines; substantially continuously determining an actual voltage difference between the first and second electric lines; and generating a fault recognition signal representative of a short circuit between the first and second electric lines when a course of the voltage difference is detected during the step of determining which differs from a predetermined reference voltage course, or when a voltage difference is detected during the step of determining which differs from a predetermined reference voltage.

32. A method according to claim 31 including detecting the entering of the object into the protected region in a contact-free manner.

* * * * *